(12) United States Patent
Huang et al.

(10) Patent No.: US 10,077,883 B2
(45) Date of Patent: Sep. 18, 2018

(54) ILLUMINATION DEVICE WITH OPTICAL UNITS INCLUDING SPIRAL STRUCTURE OPTICAL UNIT AND ILLUMINATION DEVICE HAVING THE SAME

(71) Applicant: Chun Kuang Optics Corp., Hsinchu County (TW)

(72) Inventors: Hsin-Chieh Huang, Hsinchu County (TW); Shun-Wen Teng, Hsinchu County (TW); Shun Wang, Hsinchu County (TW)

(73) Assignee: CHUN KUANG OPTICS CORP., Hsinchu County (TW)

(*) Notice: Subject to any disclaimer, the term of this patent is extended or adjusted under 35 U.S.C. 154(b) by 225 days.

(21) Appl. No.: 14/988,252

(22) Filed: Jan. 5, 2016

(65) Prior Publication Data

US 2016/0265745 A1    Sep. 15, 2016

(30) Foreign Application Priority Data

Mar. 12, 2015  (TW) .............................. 104203664 A
Oct. 21, 2015  (TW) .............................. 104216850 A

(51) Int. Cl.
*F21V 7/04* (2006.01)
*H01L 33/58* (2010.01)
(Continued)

(52) U.S. Cl.
CPC ................ *F21V 7/04* (2013.01); *F21V 5/045* (2013.01); *F21V 7/0091* (2013.01);
(Continued)

(58) Field of Classification Search
CPC . F21V 5/045; F21V 7/091; F21K 9/68; F21K 9/69; G02B 3/08; G02B 19/0028; G02B 19/0061
See application file for complete search history.

(56) References Cited

U.S. PATENT DOCUMENTS 8,068,288 B1    11/2011  Pitou
8,562,191 B2    10/2013  Okada et al.
(Continued)

FOREIGN PATENT DOCUMENTS

JP    11-133208 A      5/1999
JP    2007-305844     11/2007
(Continued)

*Primary Examiner* — Anh Mai
*Assistant Examiner* — Steven Horikoshi
(74) *Attorney, Agent, or Firm* — Li & Cai Intellectual Property (USA) Office

(57) ABSTRACT

An illumination device includes an optical component and a light-emitting module. The optical component includes a light-transmitting body, a first optical unit, and a second optical unit. The first optical unit has a light input surface and a plurality of surrounding structures surrounding the light input surface and arranged in a pattern of concentric circles, and each surrounding structure has a first surrounding surface and a second surrounding surface. The second optical unit has a spiral structure surrounding the light output surface of the light-transmitting body and a surrounding frame surrounding the light output surface of the light-transmitting body and the spiral structure, and a relative height from a topmost surface of the spiral structure to the light output surface of the light-transmitting body is increased gradually from inner to outer. The light-emitting module is disposed under the light input surface of the first optical unit.

16 Claims, 12 Drawing Sheets

(51) Int. Cl.
  *F21V 5/04*    (2006.01)
  *F21V 7/00*    (2006.01)
  *G02B 19/00*   (2006.01)
  *H01L 33/60*   (2010.01)
  *F21Y 115/10*  (2016.01)

(52) U.S. Cl.
  CPC ..... *G02B 19/0028* (2013.01); *G02B 19/0061* (2013.01); *H01L 33/58* (2013.01); *F21Y 2115/10* (2016.08); *H01L 33/60* (2013.01)

(56) References Cited

U.S. PATENT DOCUMENTS

2011/0043120 A1* 2/2011 Panagotacos .......... B64D 47/04
                                              315/224
2013/0265777 A1  10/2013 Zollers et al.

FOREIGN PATENT DOCUMENTS

| JP | 2010-92765 A  | 4/2010 |
| JP | 2010-129202 A | 6/2010 |
| JP | 2010-170734 A | 8/2010 |
| JP | 2012-4095 A   | 1/2012 |
| JP | 2012-28010 A  | 2/2012 |
| JP | 2013-196877 A | 9/2013 |

* cited by examiner

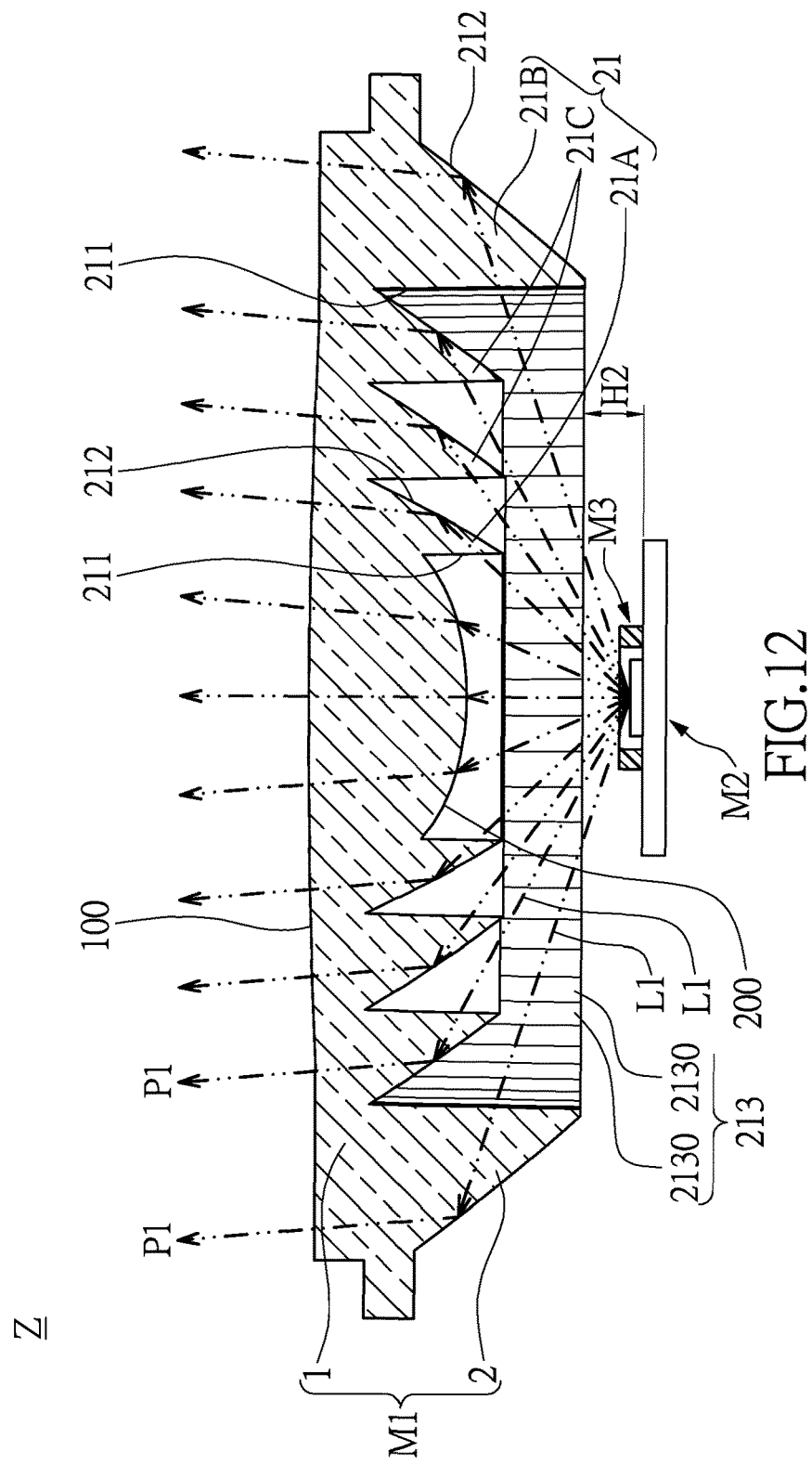

ILLUMINATION DEVICE WITH OPTICAL UNITS INCLUDING SPIRAL STRUCTURE OPTICAL UNIT AND ILLUMINATION DEVICE HAVING THE SAME

BACKGROUND OF THE INVENTION

1. Field of the Invention

The instant disclosure relates to an illumination device and an optical component thereof, and more particularly to an illumination device and an optical component thereof for increasing light-mixing effect and light uniformity.

2. Description of Related Art

A light emitting diode (LED) is a kind of semiconductor device, which exploits the property of direct band gap semiconductor material to convert electric energy into light energy efficiently and has the advantages of long service time, high stability and low power consumption and is developed to replace the traditional non-directivity light tube and incandescent lamp.

The LED is a point-like light source and has high directivity so that the lighting surface of the LED is narrower than that of the traditional light sources, and the luminous intensity of the LED is gradually reduced while the lighting distance is increased, so that the LED is more suitable for providing short-distance and small area lighting fixture, such as table lamp.

SUMMARY OF THE INVENTION

One aspect of the instant disclosure relates to an illumination device and an optical component thereof for increasing light-mixing effect and light uniformity.

One of the embodiments of the instant disclosure provides an optical component, comprising a light-transmitting body, a first optical unit, and a second optical unit. The light-transmitting body has a light output surface. The first optical unit is disposed on a bottom side of the light-transmitting body. The first optical unit has a light input surface and a plurality of surrounding structures surrounding the light input surface and arranged in a pattern of concentric circles, and each surrounding structure has a first surrounding surface and a second surrounding surface connected to the first surrounding surface. The second optical unit is disposed on a top side of the light-transmitting body. The second optical unit has a spiral structure surrounding the light output surface of the light-transmitting body and a surrounding frame surrounding the light output surface of the light-transmitting body and the spiral structure, and a relative height from a topmost surface of the spiral structure to the light output surface of the light-transmitting body is increased gradually from inner to outer. More particularly, a main light beam generated by a light-emitting module disposed under the light input surface of the first optical unit passes the first surrounding surface of each surrounding structure and is reflected by the second surrounding surface of each surrounding structure, to form a main projection light source passing through the light output surface of the light-transmitting body.

Another one of the embodiments of the instant disclosure provides an optical component, comprising a light-transmitting body and a first optical unit. The light-transmitting body has a light output surface. The first optical unit is disposed on a bottom side of the light-transmitting body. The first optical unit has a light input surface and a plurality of surrounding structures surrounding the light input surface and arranged in a pattern of concentric circles, and each surrounding structure has a first surrounding surface and a second surrounding surface connected to the first surrounding surface. More particularly, a main light beam generated by a light-emitting module disposed under the light input surface of the first optical unit passes the first surrounding surface of each surrounding structure and is reflected by the second surrounding surface of each surrounding structure, to form a main projection light source passing through the light output surface of the light-transmitting body.

Yet another one of the embodiments of the instant disclosure provides an illumination device, comprising an optical component and a light-emitting module. The optical component comprises a light-transmitting body, a first optical unit, and a second optical unit. The light-transmitting body has a light output surface. The first optical unit is disposed on a bottom side of the light-transmitting body. The first optical unit has a light input surface and a plurality of surrounding structures surrounding the light input surface and arranged in a pattern of concentric circles, and each surrounding structure has a first surrounding surface and a second surrounding surface connected to the first surrounding surface. The second optical unit is disposed on a top side of the light-transmitting body. The second optical unit has a spiral structure surrounding the light output surface of the light-transmitting body and a surrounding frame surrounding the light output surface of the light-transmitting body and the spiral structure, and a relative height from a topmost surface of the spiral structure to the light output surface of the light-transmitting body is increased gradually from inner to outer. The light-emitting module is disposed under the light input surface of the first optical unit. More particularly, a main light beam generated by the light-emitting module passes the first surrounding surface of each surrounding structure and is reflected by the second surrounding surface of each surrounding structure, to form a main projection light source passing through the light output surface of the light-transmitting body.

More particularly, the surrounding structures are divided into an innermost surrounding structure surrounding the light input surface and connected to the light input surface, an outermost surrounding structure surrounding the innermost surrounding structure, and at least one middle surrounding structure disposed between the innermost surrounding structure and the outermost surrounding structure. Therefore, an auxiliary light beam generated by the light-emitting module passes through the first surrounding surface of the outermost surrounding structure and is reflected by the second surrounding surface of the outermost surrounding structure, to form an auxiliary projection light source passing through the spiral structure.

More particularly, at least one of the surrounding structures has a surrounding microlens disposed on the first surrounding surface, and the surrounding microlens has a plurality of micro convex portions or micro concave portions sequentially connected to one another.

More particularly, the spiral structure has a spiral plane portion, a spiral convex portion, or a spiral concave portion disposed on a top side thereof.

More particularly, the light input surface of the first optical unit is a plane surface, a convex surface, or a concave surface, the light output surface of the light-transmitting body is a plane surface, a convex surface, or a concave surface, and an area of the light output surface is larger than, equal to, or smaller than an area of the light input surface.

More particularly, the illumination device further comprises a light-reflecting ring disposed under the light input surface of the first optical unit and surrounding the light-emitting module.

Therefore, due to the design of "the first optical unit having a light input surface and a plurality of surrounding structures surrounding the light input surface and arranged in a pattern of concentric circles" and "each surrounding structure having a first surrounding surface and a second surrounding surface connected to the first surrounding surface", the main light beam generated by a light-emitting module disposed under the light input surface of the first optical unit passes the first surrounding surface of each surrounding structure and is reflected by the second surrounding surface of each surrounding structure, to form a main projection light source passing through the light output surface of the light-transmitting body, so as to enhance light-mixing effect and light uniformity of the illumination device and the optical component thereof.

To further understand the techniques, means and effects of the instant disclosure applied for achieving the prescribed objectives, the following detailed descriptions and appended drawings are hereby referred to, such that, and through which, the purposes, features and aspects of the instant disclosure can be thoroughly and concretely appreciated. However, the appended drawings are provided solely for reference and illustration, without any intention to limit the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

FIG. 12 shows a lateral, cross-sectional, schematic view of the illumination device having a distance from the light-emitting surface of the light-emitting module to the bottom surface of the optical component in a range of a second predetermined height according to the second embodiment of the instant disclosure.

DETAILED DESCRIPTION OF THE PREFERRED EMBODIMENTS

The embodiments of "an illumination device and an optical component thereof" of the instant disclosure are described. Other advantages and objectives of the instant disclosure can be easily understood by one skilled in the art from the disclosure. The instant disclosure can be applied in different embodiments. Various modifications and variations can be made to various details in the description for different applications without departing from the scope of the instant disclosure. The drawings of the instant disclosure are provided only for simple illustrations, but are not drawn to scale and do not reflect the actual relative dimensions. The following embodiments are provided to describe in detail the concept of the instant disclosure, and are not intended to limit the scope thereof in any way.

First Embodiment

Referring to FIG. 1 to FIG. 5, the first embodiment of the instant disclosure provides an illumination device Z, comprising an optical component M1 and a light-emitting module M2.

Figure 1:
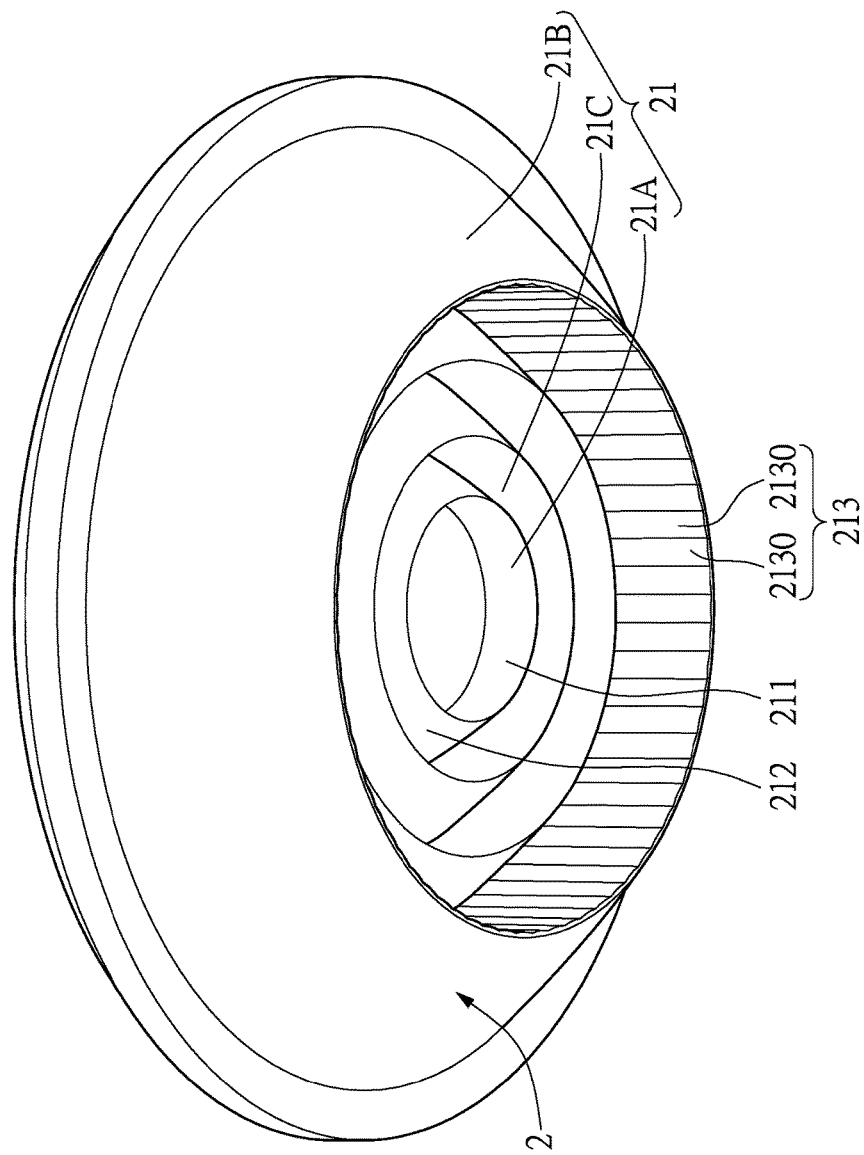
FIG. 1 shows a perspective, schematic view of the optical component according to the first embodiment of the instant disclosure.
Figure 3:
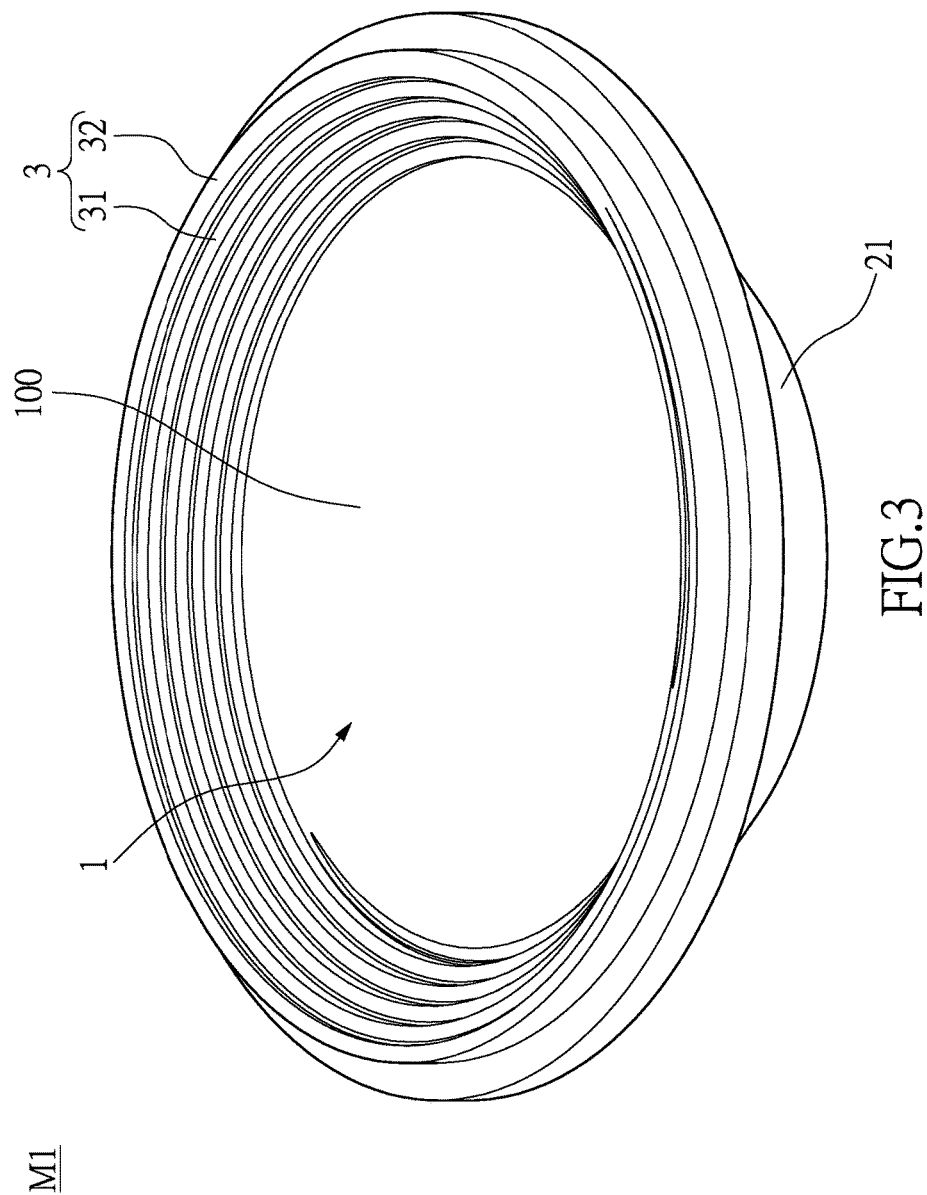
FIG. 3 shows another perspective, schematic view of the optical component according to the first embodiment of the instant disclosure.
Figure 5:
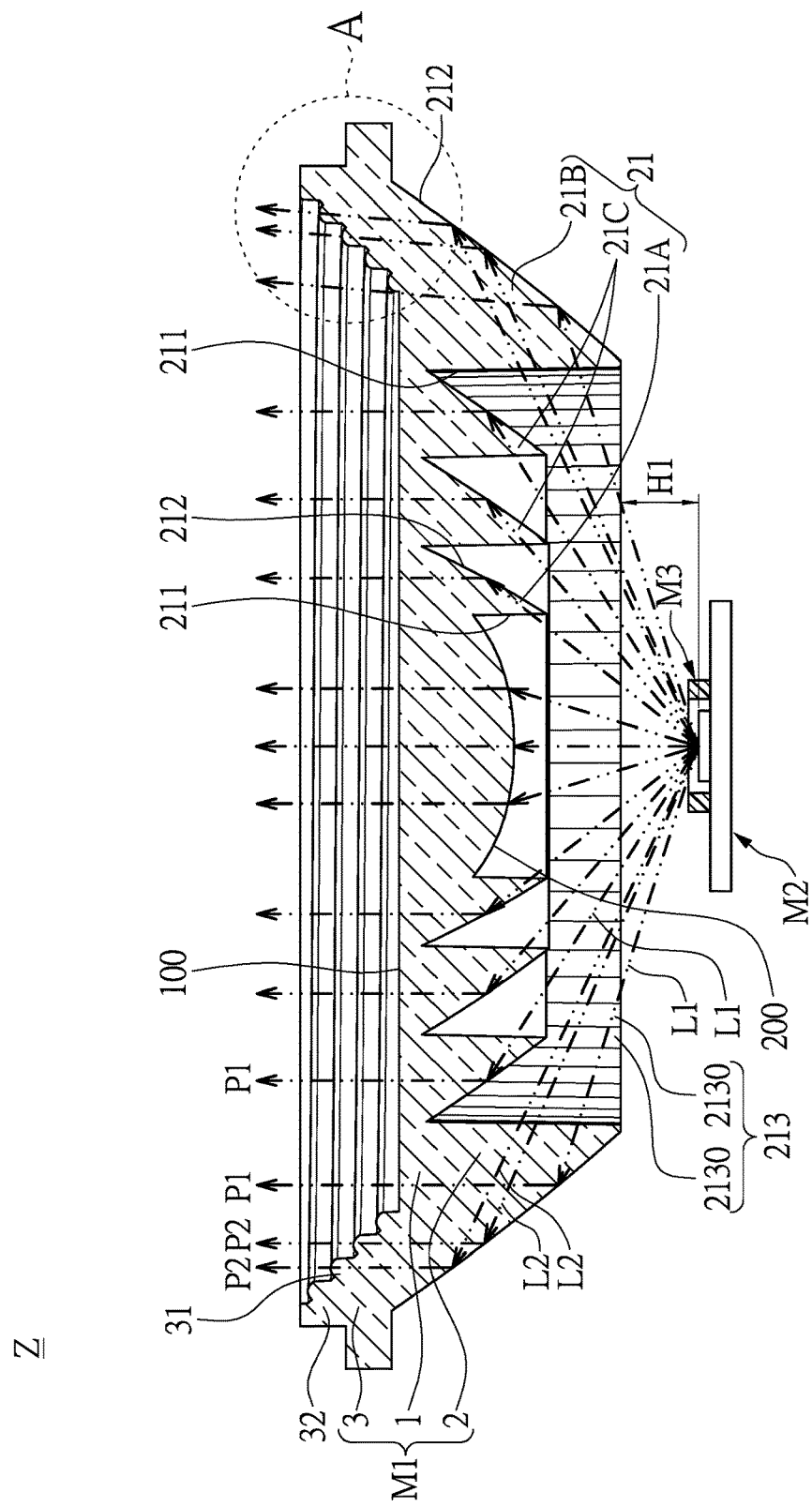
FIG. 5 shows a lateral, cross-sectional, schematic view of the illumination device having a distance from the light-emitting surface of the light-emitting module to the bottom surface of the optical component in a range of a first predetermined height according to the first embodiment of the instant disclosure.

First, referring to FIG. 1, FIG. 3, and FIG. 5, the optical component M1 comprises a light-transmitting body 1, a first optical unit 2, and a second optical unit 3, and the light-transmitting body 1, the first optical unit 2, and the second optical unit 3 may be integrally formed as a single light-transmitting component or a single transparent component. For example, the optical component M1 may be made of plastic, glass, silicone or other light-transmitting material, and the first optical unit 2 and the second optical unit 3 not only can be formed as a circular shape as shown in figures of the instant disclosure, but also can be formed as any shapes, such as an elliptical shape for generating an elliptical optical speckle pattern, an rectangular shape for generating an rectangular optical speckle pattern, or a star shape for generating a star optical speckle pattern, etc., but that is merely an example and is not meant to limit the instant disclosure.

Moreover, referring to FIG. 1, FIG. 3, and FIG. 5, the light-transmitting body 1 has a light output surface 100, the first optical unit 2 is disposed on a bottom side of the light-transmitting body 1, and the second optical unit 3 is disposed on a top side of the light-transmitting body 1. For example, the light output surface 100 of the light-transmitting body 1 may be a plane surface, a convex surface, or a concave surface. As shown in FIG. 5, the first embodiment of the instant disclosure uses a plane light output surface 100 as an example, but that is merely an example and is not meant to limit the instant disclosure.

Figure 2:
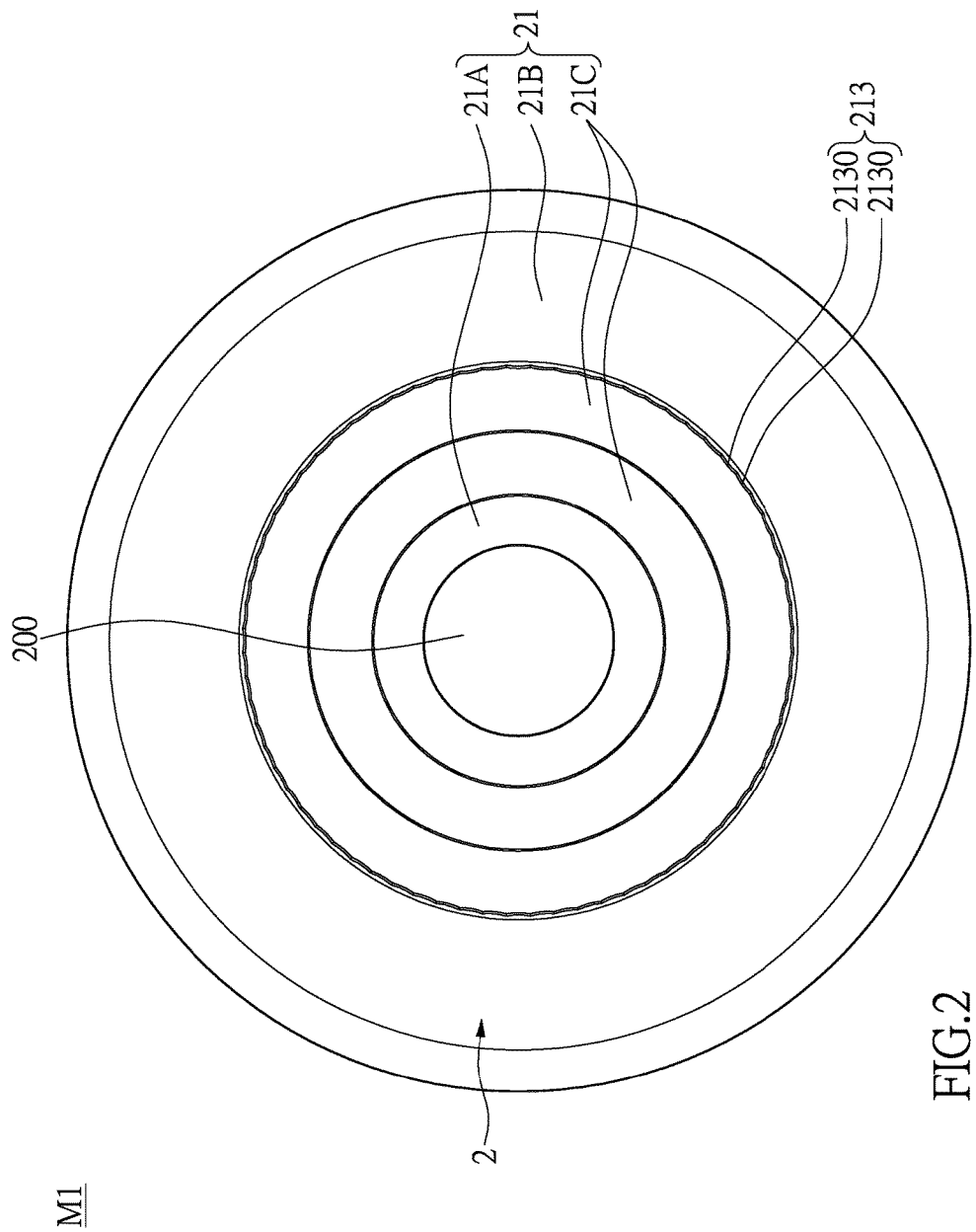
FIG. 2 shows a bottom, schematic view of the optical component according to the first embodiment of the instant disclosure.

More particularly, referring to FIG. 1, FIG. 2, and FIG. 5, the first optical unit 2 has a light input surface 200 and a plurality of surrounding structures 21 surrounding the light input surface 200 and arranged in a pattern of concentric circles, and each surrounding structure 21 has a first surrounding surface 211 (i.e., a surrounding light input surface) and a second surrounding surface 212 (i.e., a surrounding light-reflecting surface) connected to the first surrounding surface 211. For example, the light input surface 200 of the first optical unit 2 may be a plane surface, a convex surface, or a concave surface. In addition, an area of the light output surface 100 may be larger than, equal to, or smaller than an area of the light input surface 200 according to different requirements. For example, when the first optical unit 2 and the second optical unit 3 are mated with each other, the area of the light output surface 100 is larger than the area of the light input surface 200, so as to increase light output efficiency and illumination intensity. It is worth mentioning that at least one of the surrounding structures 21 has a surrounding microlens 213 disposed on the first surrounding surface 211, and the surrounding microlens 213 has a plurality of micro convex portions 2130 (or micro concave portions) sequentially connected to one another so as to enhance light-mixing effect and light uniformity.

Figure 4:
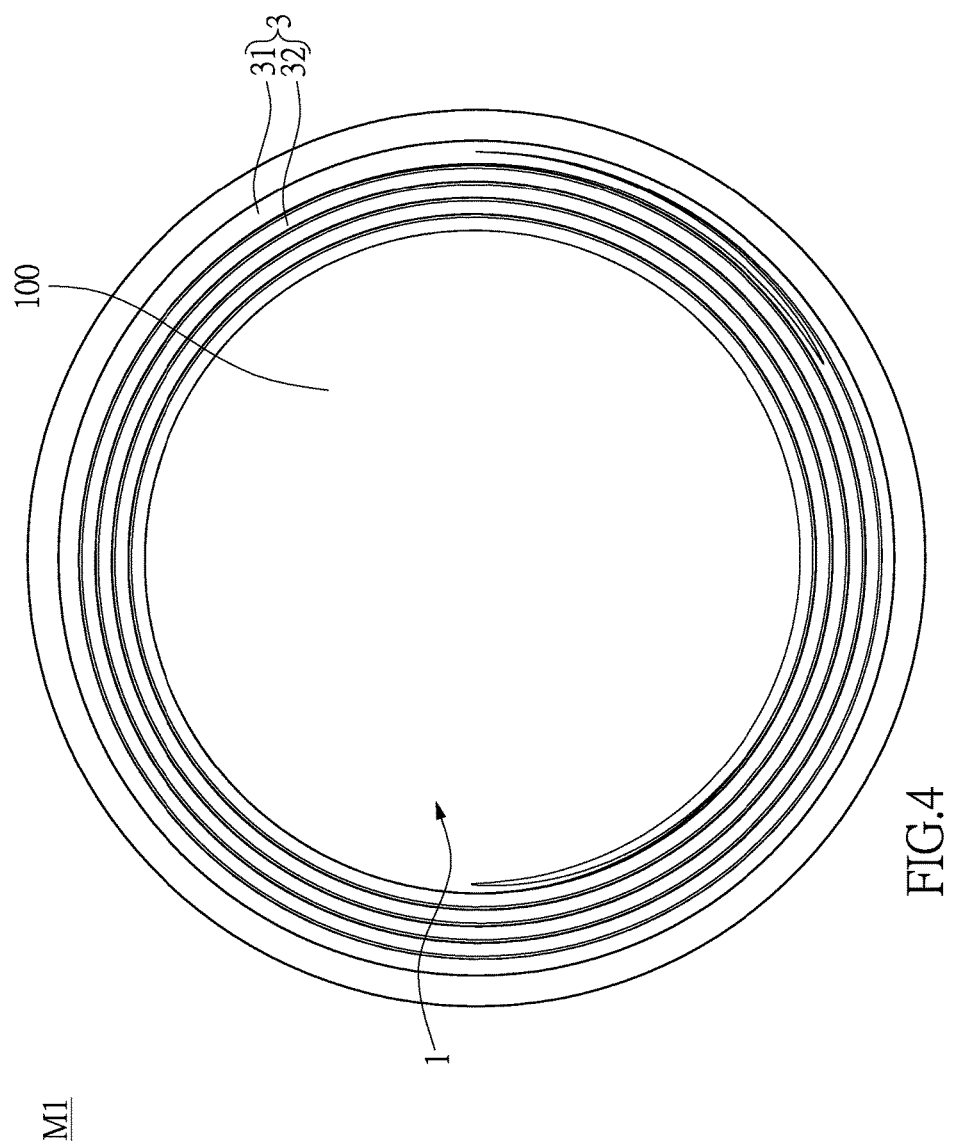
FIG. 4 shows a top, schematic view of the optical component according to the first embodiment of the instant disclosure.

Furthermore, referring to FIG. 3, FIG. 4, and FIG. 5, the second optical unit 3 has a spiral structure 31 surrounding the light output surface 100 of the light-transmitting body 1 and a surrounding frame 32 surrounding the light output surface 100 of the light-transmitting body 1 and the spiral structure 31. For example, referring to FIG. 5 and FIG. 6, the spiral structure 31 has a spiral convex portion 31A disposed on a top side thereof. In addition, a relative height (d1<d2<d3<d4) from a topmost surface of the spiral structure 31 to the light output surface 100 of the light-transmitting body 1 is increased gradually from inner to outer, that is to say, the relative height (d1<d2<d3<d4) of the spiral structure 31 relative to the light output surface 100 of the light-transmitting body 1 is increased gradually from an optical axis of the optical component M1 to an outer perimeter surface of the optical component M1, but that is merely an example and is not meant to limit the instant disclosure. For example, the spiral structure 31 may be spirally disposed on the light-transmitting body 1 along a regular or irregular 3D spiral track.

More particularly, as shown in FIG. 5, the light-emitting module M2 is disposed under or right under the light input surface 200 of the first optical unit 2. For example, the light-emitting module M2 includes a circuit substrate and a plurality of LEDs disposed on the circuit substrate in order to provide light source, but that is merely an example and is not meant to limit the instant disclosure.

Please note, as shown in FIG. 5, the illumination device Z further comprises a light-reflecting ring M3 disposed under the light input surface 200 of the first optical unit 2 and surrounding the light-emitting module M2. For example, the light-reflecting ring M3 may be a single detachable component or a fixed component disposed on a predetermined position.

Therefore, as shown in FIG. 5, when the distance from the light-emitting surface of the light-emitting module M2 to the bottom surface of the optical component M1 is in a range of a first predetermined height H1, a main light beam L1 generated by the light-emitting module M2 passes the first surrounding surface 211 of each surrounding structure 21 and is reflected by the second surrounding surface 212 of each surrounding structure 21, in order to form a main projection light source P1 passing through the light output surface 100 of the light-transmitting body 1 and goes outside.

More particularly, referring to FIG. 1, FIG. 2, and FIG. 5, the surrounding structures 21 may be divided into an innermost surrounding structure 21A surrounding the light input surface 200 and connected to the light input surface 200, an outermost surrounding structure 21B surrounding the innermost surrounding structure 21A, and at least one middle surrounding structure 21C disposed between the innermost surrounding structure 21A and the outermost surrounding structure 21B. For example, there are two middle surrounding structures 21C shown in the first embodiment of the instant disclosure. In addition, the surrounding microlens 213 also can be disposed on the first surrounding surface 211 of the innermost surrounding structure 21A or the middle surrounding structure 21C so as to enhance light-mixing effect and light uniformity.

Therefore, an auxiliary light beam L2 generated by the light-emitting module M2 passes through the first surrounding surface 211 (may be with the surrounding microlens 213 or not) of the outermost surrounding structure 21B and is reflected by the second surrounding surface 212 of the outermost surrounding structure 21B, in order to form an auxiliary projection light source P2 passing through the light output surface 100 and the spiral structure 31 and goes outside.

It is worth noting that the distance from the light-emitting surface of the light-emitting module M2 to the bottom surface of the optical component M1 is in a range of a first predetermined height H1, so that the main projection light source P1 and the auxiliary projection light source P2 are shown as collimated projection light sources collimatedly projected outside the optical component M1. Moreover, the light output surface 100 of the light-transmitting body 1 is surrounded by the surrounding frame 32, so that the user do not see the main projection light source P1 and the auxiliary projection light source P2 projected outside the light output surface 100 of the light-transmitting body 1 due to the shelter of the surrounding frame 32, so as to solve the glare problem. In addition, the optical component M1 has an empty space formed above the light output surface 100 and surrounding by the second optical unit 3, so that the material cost for making the optical component M1 and the weight of the optical component M1 are decreased.

Figure 6:
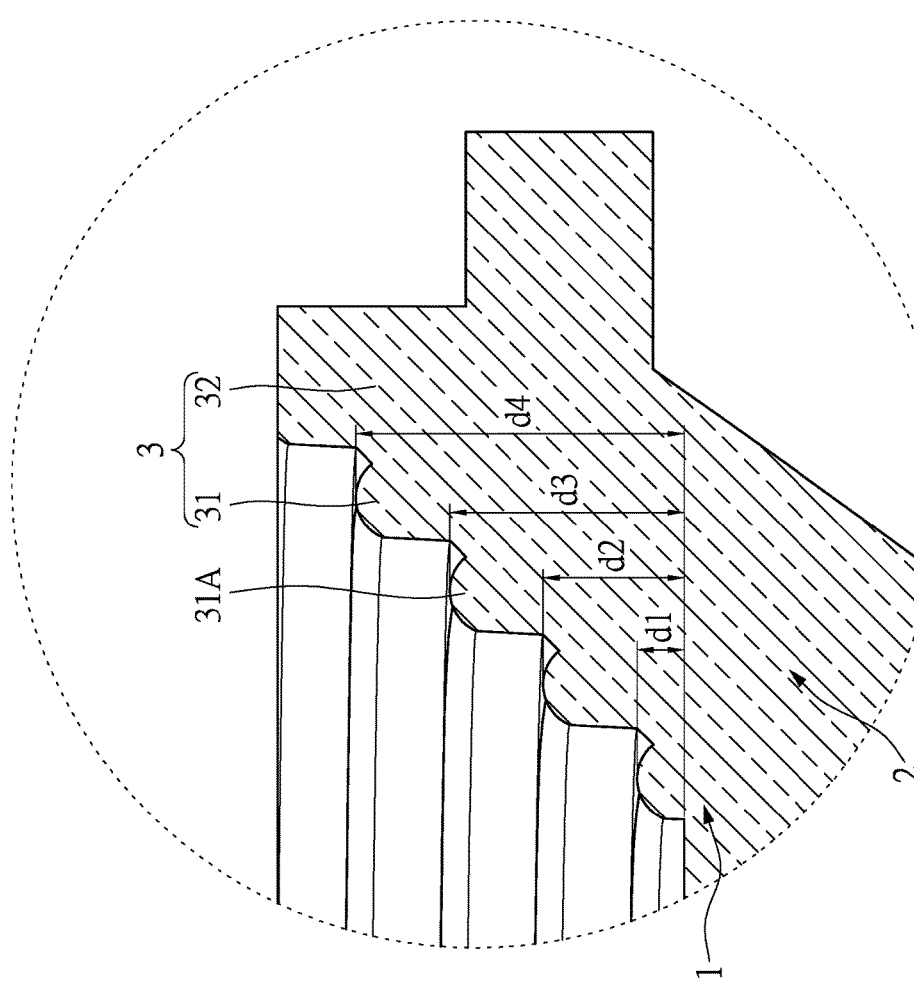
FIG. 6 shows an enlarged view taken on part A of FIG. 5.
Figure 7:
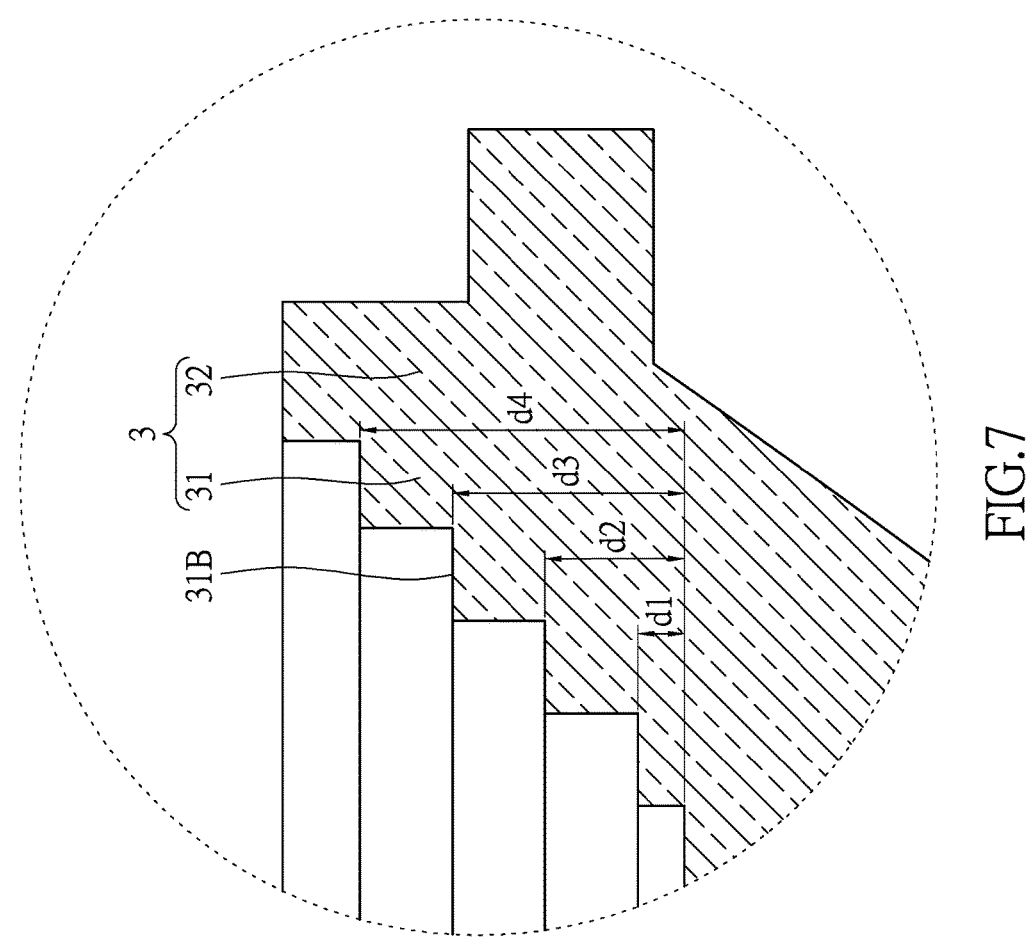
FIG. 7 shows a schematic view of the spiral convex portion as shown in FIG. 6 replaced by a spiral plane portion according to the first embodiment of the instant disclosure.
Figure 8:
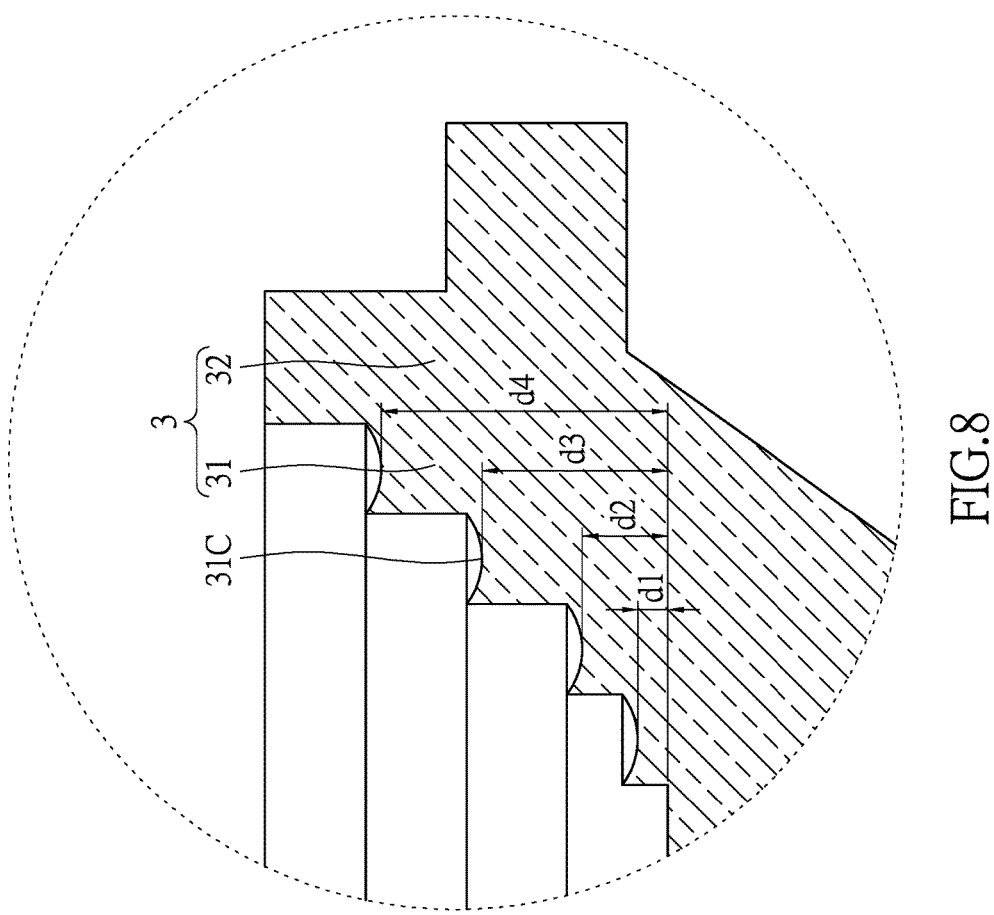
FIG. 8 shows a schematic view of the spiral convex portion as shown in FIG. 6 replaced by a spiral concave portion according to the first embodiment of the instant disclosure.

Please note, referring to FIG. 6 to FIG. 8, the spiral convex portion 31A (as shown in FIG. 6) can be replaced by a spiral plane portion 31B (as shown in FIG. 7) or a spiral concave portion 31C (as shown in FIG. 8) according to different requirements. Therefore, the auxiliary projection light source P2 can show different light patterns according to different optical structures such as the spiral convex portion 31A, the spiral plane portion 31B, or the spiral concave portion 31C.

Figure 9:
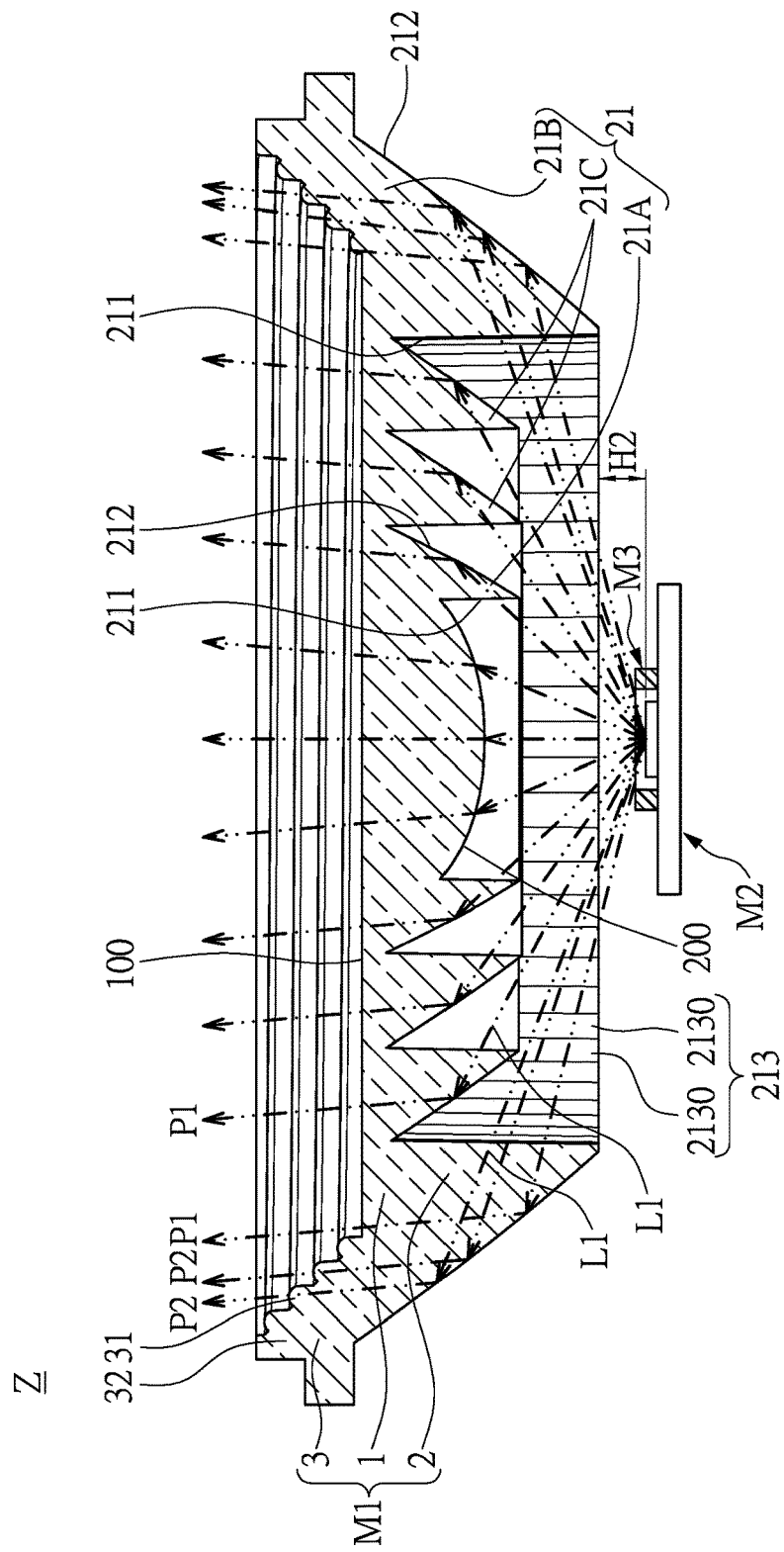
FIG. 9 shows a lateral, cross-sectional, schematic view of the illumination device having a distance from the light-emitting surface of the light-emitting module to the bottom surface of the optical component in a range of a second predetermined height according to the first embodiment of the instant disclosure.

More particularly, as shown in FIG. 9, when the distance from the light-emitting surface of the light-emitting module M2 to the bottom surface of the optical component M1 is in a range of a second predetermined height H2, a main light beam L1 generated by the light-emitting module M2 passes the first surrounding surface 211 of each surrounding structure 21 and is reflected by the second surrounding surface 212 of each surrounding structure 21, in order to form a main projection light source P1 passing through the light output surface 100 of the light-transmitting body 1 and goes outside. In addition, an auxiliary light beam L2 generated by the light-emitting module M2 passes through the first surrounding surface 211 (may be with the surrounding microlens 213 or not) of the outermost surrounding structure 21B and is reflected by the second surrounding surface 212 of the outermost surrounding structure 21B, in order to form an auxiliary projection light source P2 passing through the light output surface 100 and the spiral structure 31 and goes outside. It is worth noting that the distance from the light-emitting surface of the light-emitting module M2 to the bottom surface of the optical component M1 is in a range of a second predetermined height H2, so that the main projection light source P1 and the auxiliary projection light source P2 are shown as diffused projection light sources diffusedly projected outside the optical component M1.

Figure 10:
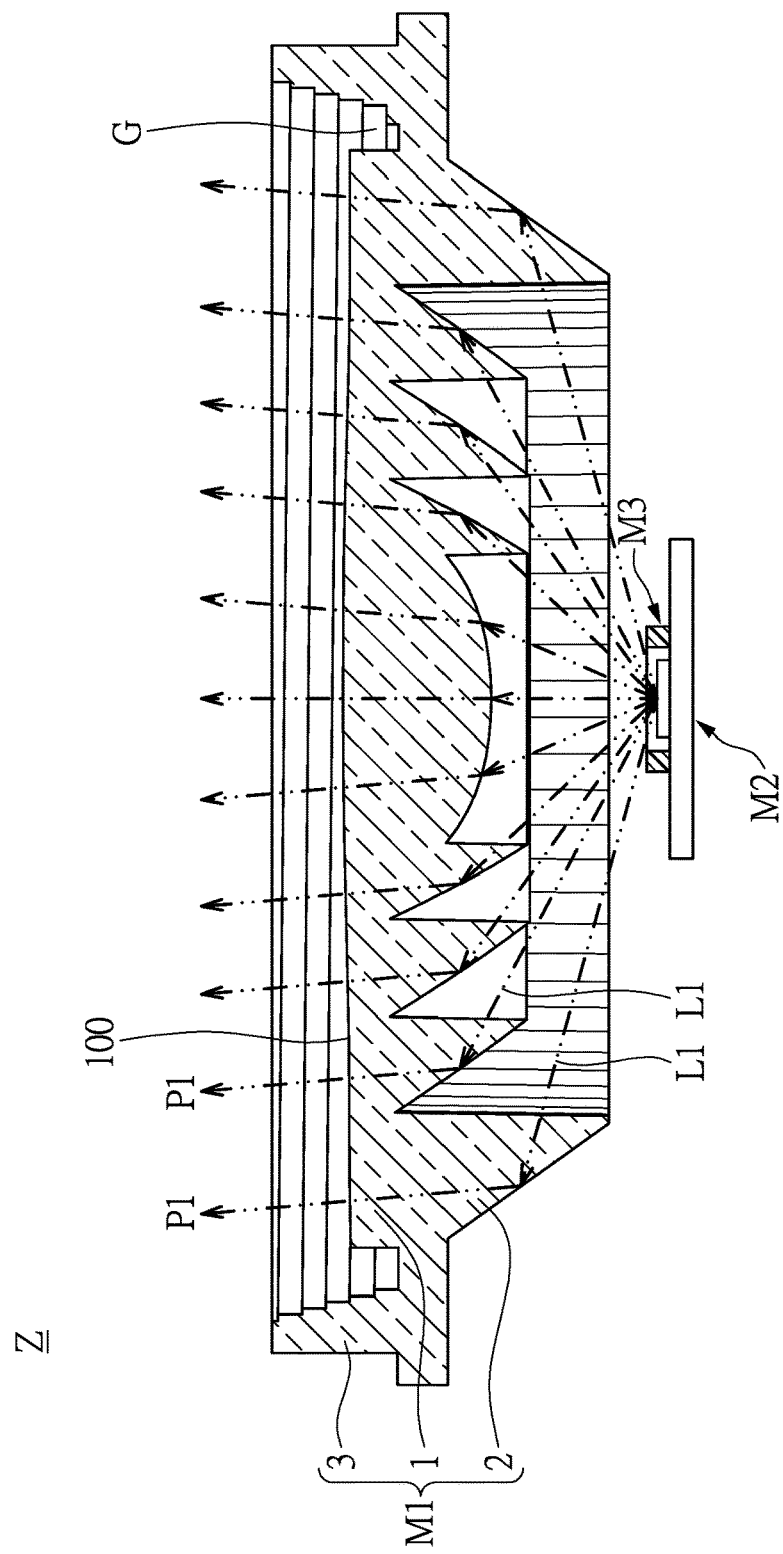
FIG. 10 shows a lateral, cross-sectional, schematic view of the second optical unit being surroundingly disposed on an outer perimeter surface of the light-transmitting body, and a surrounding gap being formed between the light output surface of the light-transmitting body and the second optical unit according to the first embodiment of the instant disclosure.

Please note, as shown in FIG. 10, the second optical unit 3 is surroundingly disposed on an outer perimeter surface of the light-transmitting body 1, and a surrounding gap G is formed between the light output surface 100 of the light-transmitting body 1 and the second optical unit 3, so that the second optical unit 3 is more far away from the light output surface 100 in order to decrease the influence of the second optical unit 3 on the main projection light source P1 projected from the light output surface 100.

Second Embodiment

Figure 11:
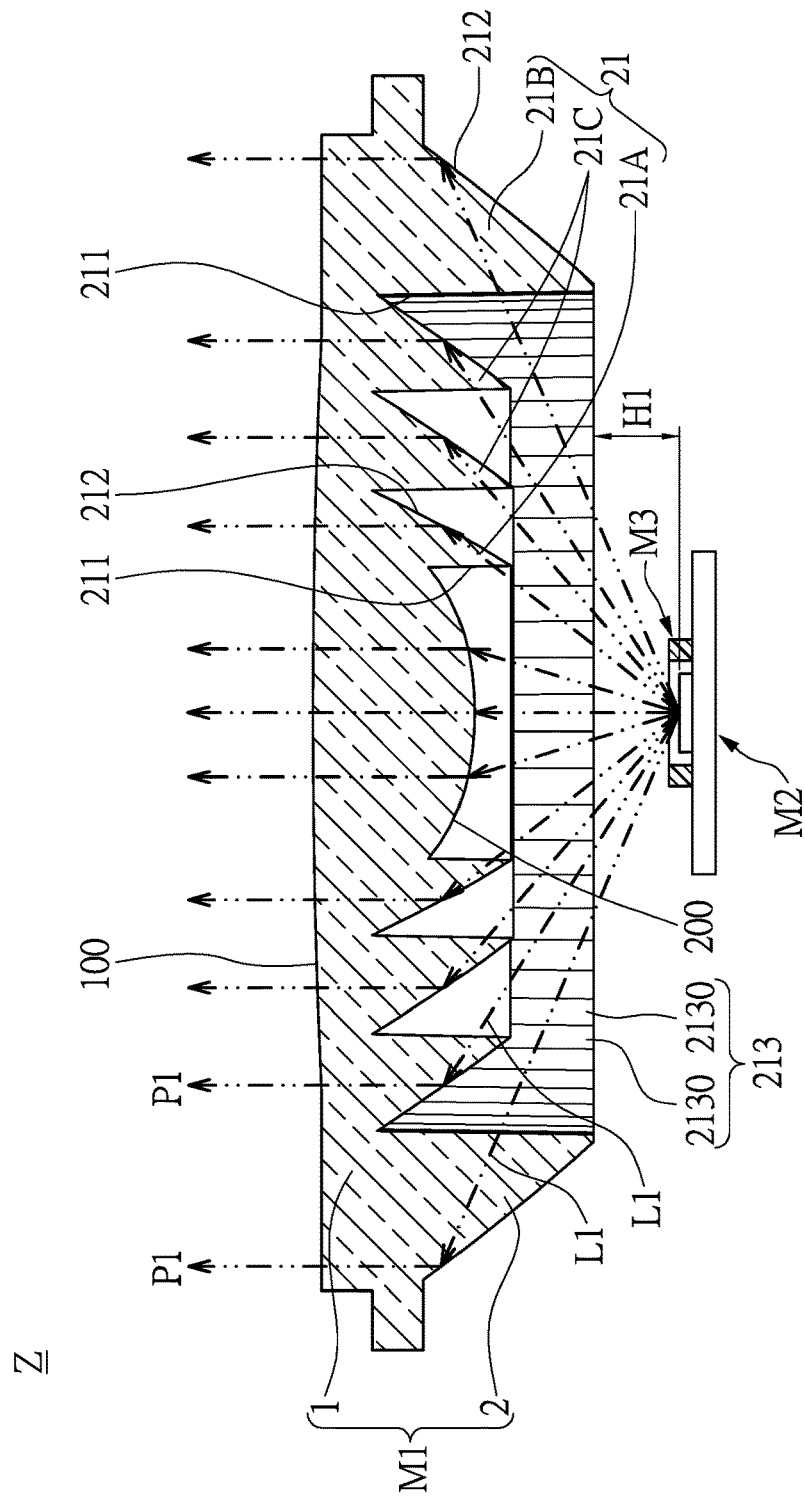
FIG. 11 shows a lateral, cross-sectional, schematic view of the illumination device having a distance from the light-emitting surface of the light-emitting module to the bottom surface of the optical component in a range of a first predetermined height according to the second embodiment of the instant disclosure.

Referring to FIG. 11 and FIG. 12, the second embodiment of the instant disclosure provides an illumination device Z, comprising an optical component M1 and a light-emitting module M2, and the optical component M1 comprises a light-transmitting body 1 and a first optical unit 2. Comparing FIG. 11 with FIG. 5, or comparing FIG. 12 with FIG. 9, the difference between the second embodiment and the first embodiment is as follows: the illumination device Z of the second embodiment can omit the second optical unit 3 as shown in the first embodiment, and the main projection light source P1 is shown as a collimated projection light sources collimatedly projected outside the optical component M1 (as shown in FIG. 11) or a diffused projection light sources diffusedly projected outside the optical component M1 (as shown in FIG. 12) by using the first optical unit 2 alone.

In conclusion, due to the design of "the first optical unit 2 having a light input surface 200 and a plurality of surrounding structures 21 surrounding the light input surface 200 and arranged in a pattern of concentric circles" and "each surrounding structure 21 having a first surrounding surface 211 and a second surrounding surface 212 connected to the first surrounding surface 211", the main light beam L1 generated by a light-emitting module M2 passes the first surrounding surface 211 of each surrounding structure 21 and is reflected by the second surrounding surface 212 of each surrounding structure 21, to form a main projection light source P1 passing through the light output surface 100 of the light-transmitting body 1, so as to enhance light-mixing effect and light uniformity of the illumination device Z and the optical component M1 thereof.

The aforementioned descriptions merely represent the preferred embodiments of the instant disclosure, without any intention to limit the scope of the instant disclosure which is fully described only within the following claims. Various equivalent changes, alterations or modifications based on the claims of the instant disclosure are all, consequently, viewed as being embraced by the scope of the instant disclosure.

What is claimed is:

1. An optical component, comprising:
  a light-transmitting body having a light output surface;
  a first optical unit disposed on a bottom side of the light-transmitting body, wherein the first optical unit has a light input surface and a plurality of surrounding structures surrounding the light input surface and arranged in a pattern of concentric circles, and each surrounding structure has a first surrounding surface and a second surrounding surface connected to the first surrounding surface; and
  a second optical unit disposed on a top side of the light-transmitting body, wherein the second optical unit has a spiral structure surrounding the light output surface of the light-transmitting body and a surrounding frame surrounding the light output surface of the light-transmitting body and the spiral structure, and a relative height from a topmost surface of the spiral structure to the light output surface of the light-transmitting body is increased gradually from inner to outer;
  wherein a main light beam generated by a light-emitting module disposed under the light input surface of the first optical unit passes the first surrounding surface of each surrounding structure and is reflected by the second surrounding surface of each surrounding structure, to form a main projection light source passing through the light output surface of the light-transmitting body.

2. The optical component of claim 1, wherein the surrounding structures are divided into an innermost surrounding structure surrounding the light input surface and connected to the light input surface, an outermost surrounding structure surrounding the innermost surrounding structure, and at least one middle surrounding structure disposed between the innermost surrounding structure and the outermost surrounding structure.

3. The optical component of claim 2, wherein an auxiliary light beam generated by the light-emitting module passes through the first surrounding surface of the outermost surrounding structure and is reflected by the second surrounding surface of the outermost surrounding structure, to form an auxiliary projection light source passing through the spiral structure.

4. The optical component of claim 1, wherein at least one of the surrounding structures has a surrounding microlens disposed on the first surrounding surface, and the surrounding microlens has a plurality of micro convex portions or micro concave portions sequentially connected to one another.

5. The optical component of claim 1, wherein the spiral structure has a spiral plane portion, a spiral convex portion, or a spiral concave portion disposed on a top side thereof.

6. The optical component of claim 1, wherein the light input surface of the first optical unit is a convex surface, and an area of the light output surface is larger than, equal to, or smaller than an area of the light input surface.

7. An optical component, comprising:
  a light-transmitting body having a light output surface; and
  a first optical unit disposed on a bottom side of the light-transmitting body, wherein the first optical unit has a light input surface and a plurality of surrounding structures surrounding the light input surface and arranged in a pattern of concentric circles, and each surrounding structure has a first surrounding surface and a second surrounding surface connected to the first surrounding surface;

wherein a main light beam generated by a light-emitting module disposed under the light input surface of the first optical unit passes the first surrounding surface of each surrounding structure and is reflected by the second surrounding surface of each surrounding structure, to form a main projection light source passing through the light output surface of the light-transmitting body;

wherein the surrounding structures are divided into an innermost surrounding structure surrounding the light input surface and connected to the light input surface, an outermost surrounding structure surrounding the innermost surrounding structure, and at least one middle surrounding structure disposed between the innermost surrounding structure and the outermost surrounding structure;

wherein an auxiliary light beam generated by the light-emitting module passes through the first surrounding surface of the outermost surrounding structure and is reflected by the second surrounding surface of the outermost surrounding structure, to form an auxiliary projection light source passing through a spiral structure.

8. The optical component of claim 7, wherein at least one of the surrounding structures has a surrounding microlens disposed on the first surrounding surface, and the surrounding microlens has a plurality of micro convex portions or micro concave portions sequentially connected to one another.

9. The optical component of claim 7, wherein the light input surface of the first optical unit is a convex surface, and an area of the light output surface is larger than, equal to, or smaller than an area of the light input surface.

10. An illumination device, comprising:
an optical component comprising:
a light-transmitting body having a light output surface;
a first optical unit disposed on a bottom side of the light-transmitting body, wherein the first optical unit has a light input surface and a plurality of surrounding structures surrounding the light input surface and arranged in a pattern of concentric circles, and each surrounding structure has a first surrounding surface and a second surrounding surface connected to the first surrounding surface; and
a second optical unit disposed on a top side of the light-transmitting body, wherein the second optical unit has a spiral structure surrounding the light output surface of the light-transmitting body and a surrounding frame surrounding the light output surface of the light-transmitting body and the spiral structure, and a relative height from a topmost surface of the spiral structure to the light output surface of the light-transmitting body is increased gradually from inner to outer; and
a light-emitting module disposed under the light input surface of the first optical unit;
wherein a main light beam generated by the light-emitting module passes the first surrounding surface of each surrounding structure and is reflected by the second surrounding surface of each surrounding structure, to form a main projection light source passing through the light output surface of the light-transmitting body.

11. The illumination device of claim 10, wherein the surrounding structures are divided into an innermost surrounding structure surrounding the light input surface and connected to the light input surface, an outermost surrounding structure surrounding the innermost surrounding structure, and at least one middle surrounding structure disposed between the innermost surrounding structure and the outermost surrounding structure.

12. The illumination device of claim 11, wherein an auxiliary light beam generated by the light-emitting module passes through the first surrounding surface of the outermost surrounding structure and is reflected by the second surrounding surface of the outermost surrounding structure, to form an auxiliary projection light source passing through the spiral structure.

13. The illumination device of claim 10, wherein at least one of the surrounding structures has a surrounding microlens disposed on the first surrounding surface, and the surrounding microlens has a plurality of micro convex portions or micro concave portions sequentially connected to one another.

14. The illumination device of claim 10, wherein the spiral structure has a spiral plane portion, a spiral convex portion, or a spiral concave portion disposed on a top side thereof.

15. The illumination device of claim 10, wherein the light input surface of the first optical unit is a convex surface, and an area of the light output surface is larger than, equal to, or smaller than an area of the light input surface.

16. The illumination device of claim 10, further comprising: a light-reflecting ring disposed under the light input surface of the first optical unit and surrounding the light-emitting module.

* * * * *